US008736057B2

(12) United States Patent
Ito et al.

(10) Patent No.: US 8,736,057 B2
(45) Date of Patent: *May 27, 2014

(54) SUBSTRATE AND MANUFACTURING METHOD THEREFOR

(75) Inventors: Junichi Ito, Kitaibaraki (JP); Atsushi Yabe, Kitaibaraki (JP); Junnosuke Sekiguchi, Kitaibaraki (JP); Toru Imori, Kitaibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 272 days.

This patent is subject to a terminal disclaimer.

(21) Appl. No.: 12/734,560

(22) PCT Filed: Nov. 26, 2008

(86) PCT No.: PCT/JP2008/071452
§ 371 (c)(1),
(2), (4) Date: May 7, 2010

(87) PCT Pub. No.: WO2009/078254
PCT Pub. Date: Jun. 25, 2009

(65) Prior Publication Data
US 2010/0244258 A1  Sep. 30, 2010

(30) Foreign Application Priority Data

Dec. 17, 2007  (JP) ................. 2007-324684

(51) Int. Cl.
*H01L 23/48* (2006.01)
*H01L 23/52* (2006.01)
*H01L 29/40* (2006.01)

(52) U.S. Cl.
USPC ........... 257/773; 257/751; 257/761; 257/763; 257/769; 257/770; 257/E33.001

(58) Field of Classification Search
USPC ......... 438/627, 643, 648, 650, 653, 658, 685, 438/686; 257/751, 761, 763, 769, 770, 773, 257/E33.001
See application file for complete search history.

(56) References Cited

U.S. PATENT DOCUMENTS

| 6,294,836 | B1 * | 9/2001 | Paranjpe et al. ............. 257/767 |
| 6,479,902 | B1 * | 11/2002 | Lopatin et al. ............... 257/774 |
| 7,514,353 | B2 * | 4/2009 | Weidman et al. ............. 438/627 |
| 2003/0143837 | A1 | 7/2003 | Gandikota et al. |
| 2003/0201537 | A1 | 10/2003 | Lane et al. |
| 2005/0161817 | A1 * | 7/2005 | Meyer et al. ................ 257/751 |
| 2007/0141826 | A1 * | 6/2007 | Chowdhury et al. ......... 438/618 |
| 2007/0178690 | A1 * | 8/2007 | Nopper et al. ............... 438/618 |
| 2007/0232044 | A1 | 10/2007 | Chowdhury et al. |

FOREIGN PATENT DOCUMENTS

| JP | 5-315336 | 11/1993 |
| JP | 06-333927 | 12/1994 |
| JP | 2004-072111 | 3/2004 |
| JP | 2007-116167 | 5/2007 |
| JP | 2007-150298 | 6/2007 |
| JP | 2008-223100 | 9/2008 |
| WO | WO 00/38224 | 6/2000 |
| WO | WO 2005/038086 | 4/2005 |
| WO | WO 2009/016979 | 2/2009 |
| WO | WO 2009/016980 | 2/2009 |

OTHER PUBLICATIONS

Japanese Office Action issued by the Japanese Patent Office dated Nov. 1, 2012 (4 pages) including English version of Documents Considered to be Relevant.

* cited by examiner

*Primary Examiner* — Michelle Mandala
(74) *Attorney, Agent, or Firm* — Flynn, Thiel, Boutell & Tanis, P.C.

(57) ABSTRACT

A substrate having, on a base material, a barrier film for preventing copper diffusion containing one or more metal elements selected from tungsten, molybdenum and niobium, a metal element having a catalytic function in electroless plating such as platinum, gold, silver and palladium, and nitrogen contained in the form of a nitride of the aforementioned one or more metal elements selected from tungsten, molybdenum and niobium. The barrier film for preventing copper diffusion is manufactured by sputtering in a nitrogen atmosphere using a target containing one or more metal elements selected from tungsten, molybdenum and niobium and the aforementioned metal element having a catalytic function in electroless plating.

8 Claims, No Drawings

SUBSTRATE AND MANUFACTURING METHOD THEREFOR

BACKGROUND OF THE INVENTION

1. Field of the Invention

The present invention relates to a substrate formed on a base material and having a barrier film for preventing copper diffusion, which is used as a barrier and catalytic layer of ULSI fine copper wiring.

2. Description of the Related Art

It is well known that a copper film for ULSI fine copper wiring (damascene copper wiring) can be formed by copper electroplating using a seed layer formed by electroless plating.

Conventionally, it has been difficult to obtain sufficient adhesiveness with a deposited plating film when electroless copper plating is performed on a mirror surface such as a semiconductor wafer. The plating also has poor reactivity, making it difficult to plate the entire substrate surface uniformly. Conventionally, it has been difficult to form a uniform plating film and adequate adhesiveness thereof has not been obtained when forming a copper seed layer by electroless plating on a barrier metal layer of tantalum nitride or the like.

The inventors in this case discovered previously that by adding a water-soluble nitrogen-containing polymer with a small weight-average molecular weight (Mw) as an additive to an electroless copper plating liquid, and affixing a catalytic metal to the substrate to be plated before immersion in the liquid, or else forming a film of a catalytic metal on the outermost surface and then immersing it in the plating liquid to adsorb the polymer via nitrogen atoms on the catalytic metal, it was possible to control the plating deposition rate and crystals become extremely fine, allowing the formation of a uniform thin film with a film thickness of 15 nm or less on a wafer or other mirror surface (Japanese Patent Publication No. 2008-223100). In the examples of this reference, the inventors also showed that by first forming a film of a catalytic metal on the outermost surface and then immersing it in the plating liquid to adsorb the polymer via nitrogen atoms on the catalytic metal, it was possible to control the plating deposition rate and the crystals become extremely fine allowing the formation of a uniform thin film with a film thickness of 6 nm or less on a wafer or other mirror surface.

In such a method, or in other words in damascene copper wiring formation, a barrier layer for preventing copper diffusion must be formed in advance separately from the catalytic metal layer when a copper seed layer is provided by electroless plating after formation of the catalytic metal film, and two layers, a barrier layer and a catalytic metal layer, are formed before forming the copper seed layer. Therefore, it was difficult to apply this method to actual processing of ultrafine wiring, which cannot have thick films.

To eliminate the complication of forming two layers prior to forming the copper seed layer, the inventors in this case discovered that by forming a single layer consisting of a specific alloy thin film having both a barrier function and a catalytic function, and combining displacement plating with reductive plating for electroless plating, it was possible to form a thin copper seed layer thereon with a uniform thickness, and submitted patent applications (PCT/JP2008/063023, PCT/JP2008/063024). However, such an alloy thin film having both a barrier function and a catalytic function has an insufficient barrier properties when the film is heated to a high temperature of about 500° C., and there has been a need for greater reliability especially during long-term use in a semiconductor device.

SUMMARY OF THE INVENTION

It is an object of the present invention to provide a substrate having a barrier film for preventing copper diffusion having both a barrier function and a catalytic function, wherein the barrier properties during high-temperature heating are better than those of the aforementioned alloy thin film having a barrier function and a catalytic function.

Another object is to provide a semiconductor wafer with excellent barrier properties during high-temperature heating and high reliability even during long-term use.

The inventors in this case arrived at the present invention as a result of exhaustive research after discovering that the barrier function could be improved still further by including nitrogen in the form of a nitride of the metal having a barrier function when forming a single layer combining both a barrier function and a catalytic function by alloying a metal having a catalytic function in electroless plating with a metal having both a barrier function and the ability to substitute for a metal in an electroless plating liquid.

That is, the present invention is as follows.

(1) A substrate having, on a base material, a barrier film comprising a single layer combining both a barrier function and a catalytic function, the barrier film is a barrier film for preventing copper diffusion comprising one or more metal elements selected from tungsten, molybdenum and niobium, a metal element having a catalytic function in electroless plating, and nitrogen contained in the form of a nitride of the aforementioned one or more metal elements selected from tungsten, molybdenum and niobium.

(2) The substrate according to (1) above, wherein the metal element having a catalytic function in electroless plating is one or more selected from platinum, gold, silver and palladium.

(3) A substrate according to (1) or (2) above, wherein the barrier film for preventing copper diffusion contains the metal element having a catalytic function in electroless plating in the amount of 10 to 30 at % and the one or more metal elements selected from tungsten, molybdenum and niobium in the amount of 60 to 75 at %, with the remainder being nitrogen.

(4) A substrate according to any one of (1) to (3) above, having a copper seed layer formed by electroless copper plating on the barrier film for preventing copper diffusion using the metal element having a catalytic function as a catalyst.

(5) A substrate according to any one of (1) to (4) above, having a copper seed layer formed by electroless copper plating on the barrier film for preventing copper diffusion using the metal element having a catalytic function as a catalyst, and also having damascene copper wiring formed on the copper seed layer.

(6) A substrate manufacturing method wherein a barrier film for preventing copper diffusion comprising one or more metal elements selected from tungsten, molybdenum and niobium, a metal element having a catalytic function in electroless plating and nitrogen contained in the form of a nitride of the aforementioned one or more metal elements selected from tungsten, molybdenum and niobium is formed on a base material by sputtering in a nitrogen atmosphere using a target containing one or more metal elements selected from tungsten, molybdenum and niobium and a metal element having a catalytic function in electroless plating, and wherein the barrier film for preventing copper diffusion consists of a single layer.

(7) The substrate manufacturing method according to (6) above, wherein the metal element having a catalytic function in electroless plating is one or more selected from platinum, gold, silver and palladium.

(8) A substrate manufacturing method according to (6) or (7) above, wherein the barrier film for preventing copper diffusion contains the metal element having a catalytic function in electroless plating in the amount of 10 to 30 at % and the one or more metal elements selected from tungsten, molybdenum and niobium is in the amount of 60 to 75 at %, with the remainder being nitrogen.

(9) A substrate manufacturing method according to any one of (6) to (8) above, having a copper seed layer formed by electroless copper plating on the barrier film for preventing copper diffusion using the metal element having a catalytic function as a catalyst.

(10) A substrate manufacturing method according to any one of (6) to (9) above, having a copper seed layer formed by electroless copper plating on the barrier film for preventing copper diffusion using the metal element having a catalytic function as a catalyst, and also having damascene copper wiring formed on the copper seed layer.

(11) A semiconductor wafer using the substrate according to (5) above.

In the present invention, barrier properties during high-temperature heating are improved by forming, on a base material, a barrier film for preventing copper diffusion comprising one or more metal elements selected from tungsten, molybdenum and niobium, a metal element having a catalytic function in electroless plating such as platinum, gold, silver and palladium, and nitrogen contained in the form of a nitride of the aforementioned one or more metal elements selected from tungsten, molybdenum and niobium. When the barrier function during high-temperature heating is improved, reliability is also improved when the substrate of the present invention is used for a prolonged time in a semiconductor wafer. Furthermore, by nitriding one or more metal elements selected from tungsten, molybdenum and niobium, the component ratios in the sputtering targets of platinum, gold, silver, palladium and other catalytic metals, which are expensive, can be reduced, when barrier layers for preventing copper diffusion are formed by sputtering, allowing the production cost thereof to be reduced.

Forming the barrier film for preventing copper diffusion of the present invention allows a copper or other metal thin film layer to be formed thereon uniformly and with a sufficiently thin film thickness and excellent adhesiveness, and without corroding the surface of the underlying barrier film for preventing copper diffusion when a copper or other metal thin film is formed thereon by electroless displacement and reduction plating. The barrier film for preventing copper diffusion and the overlying electroless plating layer can also be provided with effectively no oxygen contained at the boundary between the two.

DETAILED DESCRIPTION OF THE PREFERRED EMBODIMENTS

The present invention relates to a substrate having a barrier film for preventing copper diffusion on a base material, wherein the barrier film for preventing copper diffusion comprises one or more metal elements selected from tungsten, molybdenum and niobium, a metal element having a catalytic function in electroless plating, and nitrogen in the form of a nitride with the said one or more metal elements selected from tungsten, molybdenum and niobium.

Tungsten, molybdenum and niobium are metals suited to displacement plating with copper contained in an electroless plating solution, and have a barrier function with respect to copper. The barrier film for preventing copper diffusion uses at least one or more metals selected from tungsten, molybdenum and niobium, but tungsten is especially desirable.

Because tungsten, molybdenum and niobium form strong oxide films with difficulty as compared with tantalum and titanium, an oxide layer does not remain at the boundary with the plating film when electroless plating is performed on the barrier layer for preventing copper diffusion. When oxygen is present at the boundary, wiring resistance may increase and the barrier function may decline among other ill effects.

Examples of metals having a catalytic function in electroless plating include platinum, gold, silver, palladium and the like, and it is desirable to use at least one or more metals selected from these metals, of which platinum and palladium are preferred and palladium is especially desirable. An alloy comprising two or more different metals having catalytic functions can also be used. In the present invention, having a catalytic function in electroless plating means having a catalytic function in the reaction of forming a plating film by reduction of copper or other metal ions in an electroless plating solution.

Consequently, when a copper seed layer is formed by electroless copper plating on the aforementioned barrier film for preventing copper diffusion, it can be a sufficiently thin seed layer with excellent adhesiveness that has been electrolessly plated uniformly by electroless displacement and reduction plating.

Because tungsten, molybdenum and niobium provide high-temperature barrier properties in the barrier film for preventing copper diffusion, they are preferably contained in the amount of 60 to 75 at %. Below 60 at %, the high-temperature barrier properties are reduced, and the proportion of the metal having a catalytic function becomes high enough to contaminate the plated film, increasing resistance and sometimes causing signal delay. Another problem is increased cost. Above 75 at %, the high-temperature barrier properties are reduced, and the displacement reaction takes precedence over the reduction reaction of the plating solution when providing the copper seed layer by electroless plating, so that in some cases the plated material is corroded and it is impossible to form a uniform thin film. In this case, the barrier function is reduced.

The metal having a catalytic function is preferably contained in the barrier film for preventing copper diffusion in the amount of 10 to 30 at % in order to provide high-temperature barrier properties. Below 10 at % the high-temperature barrier properties are reduced, and the displacement reaction takes precedence over the reduction reaction of the plating solution when providing the copper seed layer by electroless plating, so that in some cases the plated material is corroded and it is impossible to form a uniform thin film. In this case, the barrier function is further reduced. Above 30 at % the high-temperature barrier properties are reduced, and the proportion of the metal having a catalytic function becomes high enough to contaminate the plated film, increasing the resistance and sometimes causing signal delay. Another problem is increased cost of the film.

Moreover, in the barrier film for preventing copper diffusion of the present invention, nitrogen is contained in the form of a nitride of tungsten, molybdenum or niobium in order to provide high-temperature barrier properties, and the barrier film for preventing copper diffusion contains the aforementioned metal component having a barrier function and metal component having a catalytic function, with the remainder being nitrogen. The nitrogen is preferably contained in the barrier film for preventing copper diffusion in the amount of at least 3 at %, or more preferably 5 to 20 at %.

The composition of the barrier film for preventing copper diffusion can be determined by converting the intensity ratios of the AES depth profile into compositional ratios. In the present invention, the AES depth profile is measured using a PHI 700 Scanning Auger Nanoprobe (ULVAC-PHI, Inc.) as the measurement unit, and the spectral intensity ratios are converted to compositional ratios using the accessory software of the unit. The conversion coefficient was determined using the numerical values in the program, but could also be calculated by primary standard as necessary.

The barrier film for preventing copper diffusion is preferably formed by sputtering, and in this case sputtering is performed in a nitrogen atmosphere using, as the targets, 1 or more metal elements selected from tungsten, molybdenum and niobium and a metal element having a catalytic function in electroless plating. The tungsten, molybdenum or niobium is nitrided in the nitrogen atmosphere, and contained in the film in nitride form.

Sputtering is normally performed by introducing an inactive gas under low pressure, but in the present invention nitrogen is included in the inactive gas, and the tungsten, molybdenum or niobium is nitrided by sputtering in a nitrogen atmosphere.

When sputtering is performed in a nitrogen atmosphere the film-forming rate is delayed only for the tungsten, molybdenum or niobium, while the film-forming rate of the palladium, platinum or other metal having a catalytic function on the substrate is not delayed, resulting in a relatively higher ratio of the metal having a catalytic function in the film, which is an indication that nitrogen is contained in the form of a nitride of tungsten, molybdenum or niobium.

The composition of the barrier film for preventing copper diffusion can be adjusted by adjusting the metal compositions of the sputtering target, the partial pressure of the nitrogen in the nitrogen atmosphere and the like.

The barrier function is improved when the tungsten, molybdenum or niobium having a barrier function is nitrided. The highest heating temperature at which the barrier properties are obtained is raised from 400° C. to 500° C. by nitriding.

When the metal having a barrier function is a nitride, the concentration of the metal having a catalytic function in the resulting barrier film for preventing copper diffusion is higher than that for the metal without being nitrided when a sputtering target of the same composition is used. This is thought to be because part of the tungsten, molybdenum or niobium metal element of the barrier component is nitrided during sputtering, becoming tungsten nitride, molybdenum nitride or niobium nitride, and because this tungsten nitride, molybdenum nitride or niobium nitride has a slower film-forming rate, the catalytic metal element, which is not nitrided, comes to have a relatively faster film-forming rate than the tungsten nitride, molybdenum nitride or niobium nitride. Therefore, nitriding serves to reduce production costs because it is possible to lower the component ratio of the catalytic metal component, which is an expensive precious metal, in the target.

The barrier film for preventing copper diffusion is preferably 3 to 20 nm or more preferably 5 to 15 nm thick.

The base material on which is formed the barrier film for preventing copper diffusion in the present invention is preferably a silicon substrate, and the cleaning and wetting properties of the substrate can be improved by subjecting it to an acid treatment, alkali treatment, surfactant treatment, ultrasonic treatment or a combination of such treatments.

In the present invention, a copper seed layer can be provided by electroless copper plating on the barrier layer for preventing copper diffusion using the metal element having a catalytic function as the catalyst. This electroless copper plating is electroless displacement plating and reduction plating.

An ordinary method can be used as the electroless copper plating method when performing electroless displacement and reduction plating using the barrier film for preventing copper diffusion of the present invention. Similarly, an ordinary plating solution can be used as the plating solution.

The electroless plating solution normally contains copper ions, a copper ion complexing agent, a reducing agent, a pH adjuster and the like.

Considering the adverse effects of formalin on the environment and the human body, glyoxylic acid is preferably used as the reducing agent in the electroless copper plating solution. The electroless copper plating solution also preferably contains no sodium, which is an impurity to be avoided in semiconductor applications.

The concentration of glyoxylic acid is preferably 0.005 to 0.5 mol/L or more preferably 0.01 to 0.2 mol/L of the plating solution. Below 0.005 mol/L no plating reaction occurs, while above 0.5 mol/L the plating solution will become unstable and break down.

All commonly used copper ion sources can be used as the copper ion source in the electroless copper plating solution of the present invention, and examples include copper sulfate, copper chloride, copper nitrate and the like. All commonly used complexing agents can be used as the copper ion complexing agent, and examples include ethylenediamine tetraacetic acid, tartaric acid and the like.

Other additives commonly used in plating solutions can be used as additives, including 2,2'-bipyridyl, polyethylene glycol, potassium ferrocyanide and the like.

The electroless copper plating solution in the present invention is used at a pH of preferably 10 to 14 or more preferably 12 to 13. A commonly used pH adjuster such as sodium hydroxide, potassium hydroxide or the like can be used. However, tetramethyl ammonium hydroxide can be used for semiconductor applications in which sodium, potassium and other alkali metals are to be avoided.

It is desirable from the standpoint of bath stability and copper deposition rate that the electroless copper plating solution be used at a bath temperature of 40 to 90° C. in the present invention.

When plating using the electroless copper plating solution of the present invention, the material to be plated is immersed in the plating solution. The material to be plated is the aforementioned base material with the barrier film for preventing copper diffusion formed thereon.

More preferably, the thickness of a copper thin film prepared by electroless displacement and reduction plating in the present invention is 1 to 10 nm.

The copper thin film prepared by electroless displacement and reduction plating in the present invention is a thin plated film with a uniform film thickness. Consequently, in the case of a seed layer for damascene copper wiring it is possible to form a thin seed layer with a uniform film thickness within a fine via trench with a wiring width of 100 nm or less, resulting in a semiconductor wafer that is not liable to voids/seams or other defects.

The substrate of the present invention can be additionally provided, on the copper thin film formed by electroless plating, with wiring parts by plating. Electroplating or electroless plating can be used for the plating.

The wiring parts are preferably of copper or an alloy consisting primarily of copper, and damascene copper wiring is especially desirable. The copper electroplating liquid can be of any composition commonly used in damascene copper wire embedding, without any particular limitations, but for example it is possible to use a solution containing copper sulfate and sulfuric acid as principal components along with, as a trace component, chlorine, polyethylene glycol, bis(3-sulfopropyl) disodium disulfide, tertiary alkylamine, polyepichlorhydrin, quaternary ammonium salt adduct comprising polyepichlorhydrin, and the like. The plating solution for copper wire embedding described in Japanese Patent Publication No. 2005-038086 can also be used as the electroless copper plating solution for embedding.

EXAMPLES

The present invention is explained next by means of examples, but the present invention is not limited by these examples.

Example 1

Using a variety of sputtering alloy targets of tungsten and palladium with different compositional ratios, and by varying argon/nitrogen gas pressure ratios inside the chamber during sputtering, 10 nm-thick tungsten/palladium nitride alloy films were prepared on silicon substrates with $SiO_2$ films on the outer surface, and electroless copper plate film was formed thereon with a film thickness of 5 to 8 nm.

A 3-inch RF sputtering device (ANELVA SPF-332HS) was used for sputtered film formation. The tungsten/palladium nitride alloy film was prepared by first lowering the pressure in the chamber to $5 \times 10^{-5}$ Pa with a cryopump, then introducing a mixed gas with a specific nitrogen/argon ratio to a total pressure of 0.8 Pa, generating a plasma with 50 W of electricity, and then presputtering for 15 minutes before forming the film.

Copper film formation by electroless plating was performed under conditions of pH 12.5, 50° C.×30 seconds using a plating solution of the following composition.
(Electroless Plating Solution and Plating Conditions)
Copper sulfate: 0.02 mol/L
Ethylenediamine tetraacetic acid salt: 0.21 mol/L
Glyoxylic acid: 0.03 mol/L
2,2'-bipyridyl: 20 mg/L
pH 12.5 (tetramethylammonium hydroxide)

Substrates with the resulting electroless plated films formed thereon were evaluated as follows.

The barrier properties after 30 minutes of annealing at 500° C. were confirmed by AES depth profile measurement. "O" means that there was no neither diffusion of copper into the tungsten/palladium nitride alloy film nor reverse diffusion, while "x" means that at least one of these diffusion occurred.

To evaluate the uniformity of the plated film, the film surface was observed with a FESEM unit (JEOL JSM-6700F), and the presence or absence of areas 1 nm or more in diameter without electroless plating was confirmed. "O" means that there were no areas without electroless plating, while "x" means that areas without electroless plating were observed.

Oxidation at the boundary between the copper film and tungsten alloy film during plating was confirmed by AES depth profile measurement. "O" means that no oxygen was found at the boundary between the plated film and the tungsten alloy film, while "x" means that oxygen was confirmed.

A tape peeling test was performed using cellophane tape (Nichiban CT24) to evaluate the adhesiveness of the plated film. The presence or absence of film peeling was confirmed after the tape was affixed to the plating surface with the ball of a finger and then peeled off. "O" means that there was no peeling of the plated film, while "x" means that peeling was observed.

The aforementioned sputtered alloy thin film and electroless copper plated thin film were formed on a semiconductor substrate having a trench pattern with a line width of 90 nm and an aspect ratio of 4, and used as the seed layer for wire embedding by copper electroplating.

Wire embedding was performed at 25° C. for 60 seconds at a current density of 1 $A/dm^2$ using a plating solution of the following composition.

| Copper sulfate | 0.25 mol/L |
| Sulfuric acid | 1.8 mol/L |
| Hydrochloric acid | 10 mmol/L |

Trace additives (polyethylene glycol, bis(3-sulfopropyl) disodium disulfide, Janus green)

The 90 nm trench part was evaluated by cross-sectional TEM observation of the resulting copper plated film. The presence or absence of voids/seams was evaluated, with "O" meaning no voids/seams and "x" meaning voids/seams present.

The results are summarized in Table 1.

The general evaluation was "O" if the result was O for all 5 criteria (barrier properties, plate uniformity, oxidation resistance, plate adhesiveness and embedding properties), "Δ" if the result was O for 4 items, and "x" if the result was O for 3 items or less.

TABLE 1

| Palladium in target (at %) | N gas partial/total pressure (%) | Palladium in film (at %) | Tungsten in film (at %) | Nitrogen in film (at %) | Barrier properties | Plate uniformity | Oxidation resistance | Plate adhesiveness | Embedding properties | General evaluation |
|---|---|---|---|---|---|---|---|---|---|---|
| *10 | 0 | 6 | 94 | 0 | X | O | O | O | O | Δ |
| 10 | 30 | 12 | 73 | 15 | O | O | O | O | O | O |
| *20 | 0 | 12 | 88 | 0 | X | O | O | O | O | Δ |
| 20 | 30 | 19 | 69 | 12 | O | O | O | O | O | O |
| *30 | 0 | 20 | 80 | 0 | X | O | O | O | O | Δ |
| 30 | 30 | 28 | 63 | 9 | O | O | O | O | O | O |

*Comparative Example

No composition having barrier properties, plate uniformity, oxidation resistance, plate adhesiveness and embedding properties (general evaluation O) after vacuum annealing at 500° C. for 30 minutes was obtained when no nitrogen gas was introduced. However, when a suitable amount of nitrogen gas was introduced, appropriate conditions were found at 12 to 28 at % palladium in the film, 63 to 73 at % tungsten in the film, and 9 to 15 at % nitrogen in the film.

Example 2

Using a variety of sputtering alloy targets of tungsten and platinum with various compositional ratios, and different argon/nitrogen gas pressure ratios inside the chamber during sputtering, 10 nm-thick tungsten/platinum nitride alloy films were prepared on silicon substrates with $SiO_2$ films on the outer surface, and electroless copper plating film with a film thickness of 5 to 8 nm was formed thereon. The conditions for film sputtering and electroless plating were as in Example 1.

The barrier properties, plate uniformity, oxidation resistance, plate adhesiveness, embedding properties and general evaluation were performed by the same methods as in Example 1.

The results are summarized in Table 2.

TABLE 2

| Platinum in target (at %) | N gas partial/total pressure (%) | Platinum in film (at %) | Tungsten in film (at %) | Nitrogen in film (at %) | Barrier properties | Plate uniformity | Oxidation resistance | Plate adhesiveness | Embedding properties | General evaluation |
|---|---|---|---|---|---|---|---|---|---|---|
| *10 | 0 | 5 | 95 | 0 | X | ○ | ○ | ○ | ○ | Δ |
| 10 | 30 | 11 | 74 | 15 | ○ | ○ | ○ | ○ | ○ | ○ |
| *20 | 0 | 13 | 87 | 0 | X | ○ | ○ | ○ | ○ | Δ |
| 20 | 30 | 18 | 68 | 14 | ○ | ○ | ○ | ○ | ○ | ○ |
| *30 | 0 | 19 | 81 | 0 | X | ○ | ○ | ○ | ○ | Δ |
| 30 | 30 | 27 | 62 | 11 | ○ | ○ | ○ | ○ | ○ | ○ |

*Comparative Example

No composition having barrier properties, plate uniformity, oxidation resistance, plate adhesiveness and embedding properties (general evaluation O) was obtained when no nitrogen gas was introduced. However, when a suitable amount of nitrogen gas was introduced, appropriate conditions were found at 11 to 27 at % platinum in the film, 62 to 74 at % tungsten in the film, and 11 to 15% nitrogen in the film.

Example 3

Using a variety of sputtering alloy targets of molybdenum and gold with different compositional ratios, and different argon/nitrogen gas pressure ratios inside the chamber during sputtering, 10 nm-thick molybdenum/gold nitride alloy films were prepared on silicon substrates with $SiO_2$ films on the outer surface, and electroless copper plate was formed thereon with a film thickness of 5 to 8 nm. The conditions for film sputtering and electroless plating were as in Example 1.

The barrier properties, plate uniformity, oxidation resistance, plate adhesiveness, embedding properties and general evaluation were performed by the same methods as in Example 1.

The results are summarized in Table 3.

No composition having barrier properties, plate uniformity, oxidation resistance, plate adhesiveness and embedding properties (general evaluation O) was obtained when no nitrogen gas was introduced. However, when a suitable amount of nitrogen gas was introduced, appropriate conditions were found at 13 to 26 at % gold in the film, 62 to 73 at % molybdenum in the film, and 12 to 16% nitrogen in the film.

Example 4

Using a variety of sputtering alloy targets of niobium and silver with different compositional ratios, and different argon/nitrogen gas pressure ratios inside the chamber during sputtering, 10 nm-thick niobium/silver nitride alloy films were prepared on silicon substrates with $SiO_2$ films on the outer surface, and electroless copper plate was formed thereon with a film thickness of 5 to 8 nm. The conditions for film sputtering and electroless plating were as in Example 1.

The barrier properties, plate uniformity, oxidation resistance, plate adhesiveness, embedding properties and general evaluation were performed by the same methods as in Example 1.

TABLE 3

| Gold in target (at %) | N gas partial/total pressure (%) | Gold in film (at %) | Molybdenum in film (at %) | Nitrogen in film (at %) | Barrier properties | Plate uniformity | Oxidation resistance | Plate adhesiveness | Embedding properties | General evaluation |
|---|---|---|---|---|---|---|---|---|---|---|
| *10 | 0 | 6 | 94 | 0 | X | ○ | ○ | ○ | ○ | Δ |
| 10 | 30 | 13 | 73 | 14 | ○ | ○ | ○ | ○ | ○ | ○ |
| *20 | 0 | 12 | 88 | 0 | X | ○ | ○ | ○ | ○ | Δ |
| 20 | 30 | 18 | 66 | 16 | ○ | ○ | ○ | ○ | ○ | ○ |
| *30 | 0 | 19 | 81 | 0 | X | ○ | ○ | ○ | ○ | Δ |
| 30 | 30 | 26 | 62 | 12 | ○ | ○ | ○ | ○ | ○ | ○ |

*Comparative Example

The results are summarized in Table 4.

TABLE 4

| Silver in target (at %) | N gas partial/total pressure (%) | Silver in film (at %) | Niobium in film (at %) | Nitrogen in film (at %) | Barrier properties | Plate uniformity | Oxidation resistance | Plate adhesiveness | Embedding properties | General evaluation |
|---|---|---|---|---|---|---|---|---|---|---|
| *10 | 0 | 5 | 95 | 0 | X | ○ | ○ | ○ | ○ | Δ |
| 10 | 30 | 10 | 73 | 17 | ○ | ○ | ○ | ○ | ○ | ○ |
| *20 | 0 | 11 | 89 | 0 | X | ○ | ○ | ○ | ○ | Δ |
| 20 | 30 | 17 | 68 | 15 | ○ | ○ | ○ | ○ | ○ | ○ |
| *30 | 0 | 18 | 82 | 0 | X | ○ | ○ | ○ | ○ | Δ |
| 30 | 30 | 25 | 61 | 14 | ○ | ○ | ○ | ○ | ○ | ○ |

*Comparative Example

No composition having barrier properties, plate uniformity, oxidation resistance, plate adhesiveness and embedding properties (general evaluation O) was obtained when no nitrogen gas was introduced. However, when a suitable amount of nitrogen gas was introduced, appropriate conditions were found at 10 to 25 at % silver in the film, 61 to 73 at % molybdenum in the film, and 14 to 17 at % nitrogen in the film.

What is claimed is:

1. A substrate having, on a base material, a barrier film consisting of a single layer combining both a barrier function and a catalytic function, the barrier film is a barrier film for preventing copper diffusion comprising one or more metal elements selected from molybdenum and niobium, a metal element having a catalytic function in electroless plating, and nitrogen contained in the form of a nitride of the aforementioned one or more metal elements selected from molybdenum and niobium, wherein the barrier film for preventing copper diffusion contains the metal element having a catalytic function in electroless plating in the amount of 10 to 30 at % and the one or more metal elements selected from molybdenum and niobium in the amount of 60 to 75 at %, with the remainder being nitrogen.

2. The substrate according to claim 1, wherein the metal element having a catalytic function in electroless plating is one or more selected from platinum, gold, silver and palladium.

3. A substrate according to claim 1, having a copper seed layer formed by electroless copper plating on the barrier film for preventing copper diffusion using the metal element having a catalytic function as a catalyst.

4. A substrate according to claim 1, having a copper seed layer formed by electroless copper plating on the barrier film for preventing copper diffusion using the metal element having a catalytic function as a catalyst, and also having damascene copper wiring formed on the copper seed layer.

5. A semiconductor wafer using the substrate according to claim 4.

6. The substrate according to claim 1, wherein palladium is contained in the barrier film.

7. The substrate according to claim 1, wherein platinum is contained in the barrier film.

8. The substrate according to claim 1, wherein molybdenum and gold are contained in the barrier film.

* * * * *